US011065644B2

(12) United States Patent
Broszeit

(10) Patent No.: US 11,065,644 B2
(45) Date of Patent: Jul. 20, 2021

(54) METHOD FOR EXCITING PIEZOELECTRIC TRANSDUCERS AND SOUND-PRODUCING ARRANGEMENT

(71) Applicant: Weber Ultrasonics GmbH, Karlsbad-Ittersbach (DE)

(72) Inventor: Ralf Broszeit, Konigsbach-Stein (DE)

(73) Assignee: Weber Ultrasonics GmbH, Karlsbad-Ittersbach (DE)

( * ) Notice: Subject to any disclaimer, the term of this patent is extended or adjusted under 35 U.S.C. 154(b) by 577 days.

(21) Appl. No.: 16/073,827

(22) PCT Filed: Jan. 12, 2017

(86) PCT No.: PCT/EP2017/050612
§ 371 (c)(1),
(2) Date: Jul. 30, 2018

(87) PCT Pub. No.: WO2017/129415
PCT Pub. Date: Aug. 3, 2017

(65) Prior Publication Data

US 2019/0030568 A1 Jan. 31, 2019

(30) Foreign Application Priority Data

Jan. 29, 2016 (DE) ........................ 102016101660.8

(51) Int. Cl.
*H03G 5/00* (2006.01)
*B06B 1/02* (2006.01)
(Continued)

(52) U.S. Cl.
CPC .......... *B06B 1/0284* (2013.01); *B06B 1/0622* (2013.01); *B08B 3/12* (2013.01);
(Continued)

(58) Field of Classification Search
CPC ........................................................ H03G 5/00
See application file for complete search history.

(56) References Cited

U.S. PATENT DOCUMENTS 6,236,276 B1 5/2001 Cewers
6,352,510 B1 3/2002 Barabash et al.
(Continued)

FOREIGN PATENT DOCUMENTS

CN 1273541 11/2000
CN 1621163 6/2005
(Continued)

*Primary Examiner* — Olisa Anwah
(74) *Attorney, Agent, or Firm* — Volpe Koenig

(57) ABSTRACT

A method for exciting sound-wave producing transducers (7) which have operating frequencies defining a transducer frequency range, in which a generator (9) produces an electrical excitation signal for the transducers (7), these electrical excitation signal being fed to the transducers (7), wherein the generator (9) carries out frequency sweeps in a frequency sweep range between a minimum frequency ($f_{min}$) and a maximum frequency ($f_{max}$) with an adjustable sweep rate, with a target frequency ($f_{Ziel}$) being defined within said frequency sweep range, this method being characterized in that the minimum frequency ($f_{min}$), the maximum frequency ($f_{max}$) and the target frequency ($f_{Ziel}$) are selected in such a way that a first frequency difference ($\Delta f_1$) between the minimum frequency (fmin) and the target frequency ($f_{Ziel}$) differs in terms of magnitude from a second frequency difference ($\Delta f_2$) between the maximum frequency ($f_{max}$) and the target frequency ($f_{Ziel}$) within a number of frequency sweeps, and wherein the minimum frequency ($f_{min}$) and/or the maximum frequency ($f_{max}$) and/or the target frequency ($f_{Ziel}$) is/are modified after at least one frequency sweep in such a way that an arithmetic mean of the first frequency differences ($\Delta f_1$), formed over all frequency sweeps carried out, and an arithmetic mean of the second frequency differ-
(Continued)

ences ($\Delta f_2$), formed over all frequency sweeps carried out, are substantially the same in terms of magnitude.

12 Claims, 7 Drawing Sheets

(51) Int. Cl.

| | |
|---|---|
| ***B08B 3/12*** | (2006.01) |
| ***H04R 17/00*** | (2006.01) |
| ***H04R 3/04*** | (2006.01) |
| ***B06B 1/06*** | (2006.01) |

(52) U.S. Cl.
CPC ............... *H04R 3/04* (2013.01); *H04R 17/00* (2013.01); *B06B 2201/71* (2013.01); *H04R 2499/11* (2013.01)

(56) References Cited

U.S. PATENT DOCUMENTS

| | | | |
|---|---|---|---|
| 6,373,958 B1 | 4/2002 | Enomoto et al. | |
| 7,004,016 B1 | 2/2006 | Puskas | |
| 2005/0003737 A1 | 1/2005 | Montierth et al. | |
| 2005/0098194 A1 | 5/2005 | Christenson et al. | |
| 2006/0006761 A1 | 1/2006 | Goodson | |
| 2007/0182285 A1 * | 8/2007 | Goodson ............... | B06B 1/0284 310/328 |

FOREIGN PATENT DOCUMENTS

| | | |
|---|---|---|
| CN | 103464359 | 12/2013 |
| CN | 203648820 | 6/2014 |
| CN | 104438028 | 3/2015 |
| WO | 2005027202 | 3/2005 |

* cited by examiner

METHOD FOR EXCITING PIEZOELECTRIC TRANSDUCERS AND SOUND-PRODUCING ARRANGEMENT

BACKGROUND

The invention relates to a method for exciting ultrasonic transducers. Such a method comprises the excitation of at least one ultrasonic transducer, said transducer being designed for the generation of sound waves and exhibiting operating frequencies that define a transducer frequency range. The method furthermore makes use of a generator that has an electrical connection to the ultrasonic transducer. The generator is designed here to generate an electrical drive signal with a variable excitation frequency.

The use of piezoelectric crystals as ultrasonic transducers, here also simply called transducers, is known. The crystals can be made to oscillate by an electrical signal, and thereby transmit sound waves in the ultrasonic range. These transmitted sound waves can, for example, be used to clean contamination off components. Preferably the transducers are operated at a particular resonant frequency that depends on their construction. Frequently, multiple piezoelectric transducers are used here, whose resonant frequencies differ more or less strongly from one another. An attempt is made in this way on the one hand to achieve a greater frequency bandwidth for the transducers, in order also to be able to remove contamination of different sizes—the size of the released contamination is related to the resonant frequency of the transducer. On the other hand, through the superposition of the oscillations of transducers with different resonant frequency, the sound wave field that is output is altogether more homogeneous, which can have a positive effect on the quality of the cleaning.

Rather than a static specification for the excitation frequency for operation of the piezoelectric transducers, varying the excitation frequency over time is already known. This is referred to as sweep modulation. Applications known so far use sweep modulations with a frequency progression that repeats itself within a sweep range with a fixed specification. Frequency progressions are known here in which the excitation frequency changes linearly with time. The signal of the excitation frequency can here adopt the shape of a sawtooth or the shape of a triangle.

EP 1 997 159 B1 discloses a megasonic processing apparatus and an associated working method, which megasonic processing apparatus uses piezoelectric transducers that are operated at fundamental resonant frequencies of at least 300 kHz. In the described method, the excitation frequency for operation of the piezoelectric transducers is varied in a range that comprises all the fundamental resonant frequencies of the piezoelectric transducers in use. This range of the sweep modulation here extends over a frequency range ("transducer range") which is defined by the fundamental resonant frequencies of the piezoelectric transducers, extending beyond them above and below. What is important is that the transducer range is exceeded symmetrically above and below in the course of the sweep modulation of the excitation frequency. This should ensure that all the fundamental resonant frequencies are excited by the drive signal. In particular, this should allow for the fact that the resonant frequencies of the piezoelectric transducers can change as a result of the influence of temperature or age.

Similar apparatus and/or methods are known from the documents US 2005/0003737 A1, US 2005/0098194 A1 and U.S. Pat. No. 7,004,016 B1. In each of these documents, a sweep modulation is described that exceeds and falls below the range of the transducer frequencies. In each case, exceeding and falling below the transducer range is configured symmetrically.

In the known methods of sweep modulation known from the prior art, it is problematic that the sweep modulation has a relatively large frequency swing in order to implement the symmetrical exceeding or falling below the transducer range. Such a large frequency swing however entails increasing losses in the power stage of the generator which provides the necessary drive signals. High thermal losses consequently arise in the generator, which can limit the maximum achievable extent for the frequency swing in the sweep modulation. Moreover, as the frequency swing increases, so also does the mechanical stress on the sound transducer (ultrasonic converters, ultrasonic elements, ultrasonic transducers or the like). Additionally, in the case of narrowband or high-Q systems, the problem arises that the frequency swing of the sweep modulation must not be too large, since unwanted resonant frequencies or oscillation modes could otherwise also be excited. In the least favorable case, this can damage or destroy the entire system.

SUMMARY

The invention is based on the object of providing an improved method for the excitation of ultrasonic transducers that effectively exploits the advantages of sweep modulation and simultaneously avoids the problems described above.

This object is achieved by a method with and by a sound generation arrangement with one or more features of the invention. Advantageous developments emerge from the description and claims that follow.

It has been recognized by the applicant that the method according to the invention for exciting the transducers is particularly advantageously configured if during a number of frequency sweeps (sweep modulations) a first frequency difference between a minimum frequency at which the frequency sweep begins and a target frequency differs in terms of magnitude from a second frequency difference between a maximum frequency at which the frequency sweep ends and the target frequency. The target frequency is here defined generally as a frequency whose magnitude lies between the minimum frequency and the maximum frequency. The minimum frequency and/or the maximum frequency and/or the target frequency are modified after at least one frequency sweep in such a way that an arithmetic mean of the first differences which is formed over all the frequency sweeps carried out and an arithmetic mean of the second differences which is also formed over all the frequency sweeps carried out are substantially the same in terms of magnitude.

A frequency sweep of the excitation frequency is here carried out between the minimum frequency and the maximum frequency, wherein the excitation frequency adopts substantially all values between the minimum frequency and the maximum frequency at least once in the course of the frequency sweep. It is therefore within the sense of the invention if the excitation frequency at the beginning of the frequency sweep is equal in terms of magnitude to the minimum frequency and at the end of the frequency sweep is equal in terms of magnitude to the maximum frequency. The inverse case is equally possible. It is also within the scope of the invention if the excitation frequency is, in terms of magnitude, equal to the minimum frequency and/or the maximum frequency a plurality of times in the course of a frequency sweep.

A single transducer, preferably a piezoelectric transducer, can be employed to generate sound waves in the sense of the method according to the invention. As a result of the manufacturing method, this can exhibit irregularities in the layer thickness, so that the respective resonant frequency of transducers with the same type of construction can differ slightly from one another. Different regions of a single transducer can, moreover, be exposed to different temperature influences, whereby its resonant frequency can split into partial resonant frequencies that differ slightly from one another. A single transducer can thus define a transducer frequency range or transducer in the sense stated further above.

The frequency swing of the sweep modulation is defined as the difference between the maximum frequency and the minimum frequency. The variation, associated with the invention, of the minimum frequency, the maximum frequency and/or the target frequency in a certain number of frequency sweeps out of a total number of frequency sweeps brings with it the advantage that the frequency swing is, in substantially all the frequency sweeps, smaller than is described in the prior art. Thermal losses in the power-providing generator are thereby minimized, and at the same time the probability of failure of the transducers is reduced.

The minimum frequency and/or the maximum frequency are preferably changed after completion of at least one frequency sweep. A variation of the frequency sweep around the target frequency is thereby achieved. A change in the minimum and/or maximum frequency is easy to implement in terms of control technology, and does not require any more expensive circuitry.

According to a preferred embodiment of the method according to the invention, the minimum frequency, the maximum frequency and the target frequency are selected such that during a first frequency sweep, the first frequency difference has a first magnitude (A), and the second frequency difference has a second magnitude (B). In a subsequent frequency sweep, at least the target frequency as well as, preferably, the minimum frequency and the maximum frequency are modified in such a way that the first frequency difference has the second magnitude (B) and the second frequency difference has the first magnitude (A), wherein the first magnitude and the second magnitude preferably differ (A≠B). An alternating, symmetrically configured selection of the frequency differences around the target frequency of this sort is deemed by the applicant to be particularly advantageous. After each frequency sweep, the excitation can here be increased again from the minimum frequency up to the maximum frequency, so that the temporal progression of the excitation frequency is like a sawtooth. A sequence of frequency differences over a plurality of frequency sweeps and beyond can thus, for example, have the magnitudes (AB-BA-AB-BA-AB-BA). A "travel direction" of the change of the excitation frequency can also change after each frequency sweep; the excitation frequency can, for example, be reduced again after reaching the maximum frequency, so that the temporal progression of the excitation frequency is triangular in shape. The provision of a combination of these two variants, or of yet further variants, also lies within the scope of the invention. What is important here is that during the respective frequency sweeps, the frequency differences can exhibit the magnitude combinations referred to above.

It is particularly preferred if the target frequency is changed after completion of at least one frequency sweep. This form of the variation of the sweep modulation is then found to be particularly advantageous if the desired target frequency is not precisely known, but has to be determined in the course of the method or in the course of the frequency sweeps. In this way, a desired working point of the at least one ultrasonic transducer can be specified flexibly in response to the nature of the specific requirement.

According to an alternative embodiment, in the course of at least one frequency sweep, preferably all frequency sweeps, the excitation frequency of the drive signal is varied in such a way that the drive signal has the minimum frequency at a first point in time ($t_1$), the target frequency at a second point in time ($t_2$) and the maximum frequency at a third point in time ($t_3$), wherein the second point in time lies between the first and the third points in time, and wherein a first time difference between the first point in time the second point in time, and a second time difference between the second point in time and the third point in time, are equal in terms of magnitude.

This means in other words that during a frequency sweep the target frequency can be reached after precisely half the total duration of the frequency sweep. As a corollary this however also means that the temporal progression of the drive signal f(t) between the first point in time and the second point in time and between the second point in time and the third point in time have gradients that differ from one another if the target frequency does not lie precisely in the center between the minimum frequency and the maximum frequency. It is not in fact necessary within the scope of the method according to the invention that the first time difference and the second time difference are equal in terms of magnitude. The equality in terms of magnitude can, however, be particularly advantageously configured if a repetition rate of the sweep modulation is generated or triggered by a harmonic carrier signal, for example by a sinusoidal carrier signal. In this case, the first point in time, the second point in time and the third point in time advantageously fall on characteristic locations of the harmonic carrier signal, for example at reversal points or extreme points.

The frequency change of the drive signal in the region of the second point in time can be continuous (differentiable, in mathematical terms), but can also be configured in the form of a mathematical discontinuity.

In principle, the excitation frequency can exhibit almost any desired temporal progression in the course of a frequency sweep.

A particularly advantageous development of the method according to the invention is present if the first and the second time differences are equal in terms of magnitude. The method according to the invention is, however, in no way restricted to this, but with a suitable choice of the minimum frequency, the maximum frequency and the target frequency, the first and second time differences can also differ in terms of magnitude.

The frequency sweep is preferably chosen in such a way that in the course of at least one frequency sweep, preferably all frequency sweeps, a first derivative of the excitation frequency (or rate of frequency change of the excitation frequency) with respect to time has a constant first derivative magnitude between the first point in time and the second point in time, and has a constant second derivative magnitude between the second point in time and the third point in time. The circuitry required to realize this is simpler than a derivation or temporal change of the excitation frequency that has a non-constant magnitude.

According to a preferred embodiment, the frequency sweep is selected in such a way that in the course of at least one frequency sweep, preferably all frequency sweeps, the first derivative magnitude and the second derivative magnitude differ from one another.

When the temporal progression of the drive signal f(t) between the first point in time and the second point in time and between the second point in time and the third point in time have gradients that differ from one another, then a bend results on an appropriate graphical display on an f(t) diagram with an otherwise linear relationship between frequency and time. The associated bend angle can be less than or greater than 180°.

It is particularly preferred if at least one transducer, preferably a plurality of transducers, most preferably all transducers, are excited during a plurality of, preferably all, frequency sweeps at a respective resonant frequency. The efficiency of the excitation can be increased in this way.

It is particularly preferred if at least one transducer, preferably a plurality of transducers, most preferably all transducers, are excited during a plurality of, preferably all, frequency sweeps at a respective resonant frequency of the same order, preferably at a respective fundamental frequency. Advantageously it emerges from this form of the method, that with an excitation of all transducers with a resonant frequency of the same order, the operating parameters of the transducers are comparable, so that the homogeneity of the sound wave field that is output is increased. If transducers are excited at resonant frequencies of different orders, it is possible for resonant patterns with different spectral widths to result, so that the superposition of the sound waves output by the individual transducers can in some cases lead to inhomogeneities in the sound field.

In a preferred embodiment of the invention, the target frequency is chosen to correspond substantially to a resonant frequency, preferably a fundamental resonant frequency, of at least one transducer, and/or corresponding to a frequency in the transducer frequency range, preferably corresponding to a frequency that is formed from an arithmetic averaging of at least a few, preferably all, resonant frequencies in the transducer frequency range. Such a selection of the target frequency entails the advantage that as near as possible to all resonant frequencies, and/or all the resonant frequencies of one order, are covered in the course of one frequency sweep or in the course of a plurality of frequency sweeps. The efficiency of the excitation of the transducers is again increased hereby.

BRIEF DESCRIPTION OF THE DRAWINGS

Further preferred features and forms of embodiment of the inventions emerge from the following description of exemplary embodiments with reference to the drawing.

DETAILED DESCRIPTION

Figure 1:
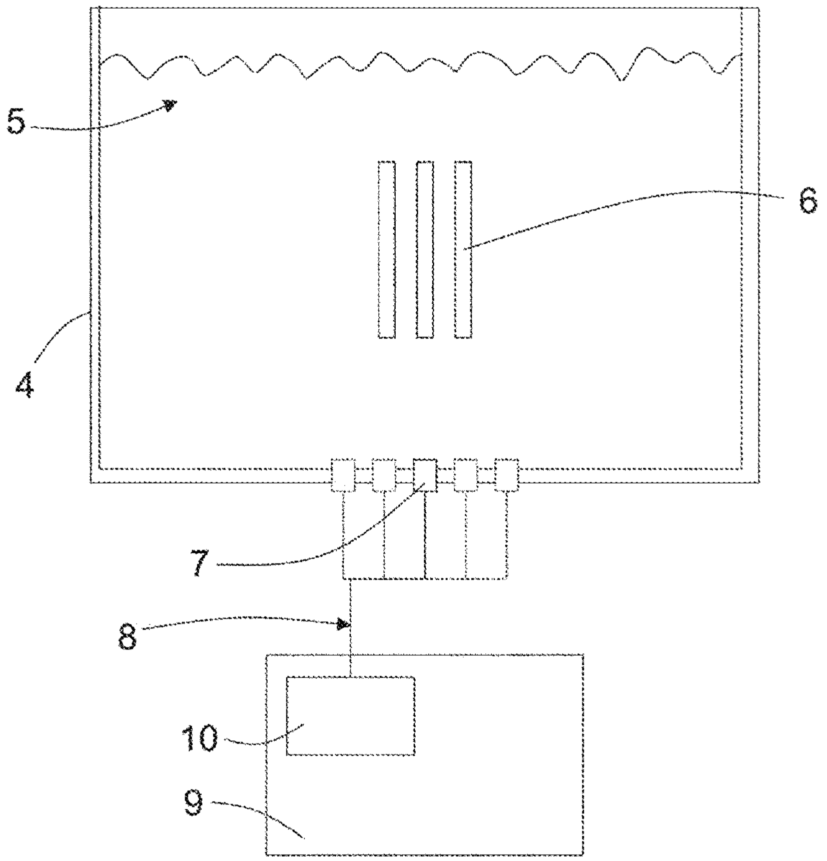
FIG. 1 shows a schematic illustration of sound generation arrangement according to the invention.

FIG. 1 shows a sound generation arrangement according to the invention on the basis of an exemplary application in which the method according to the invention can be employed, without however being restricted to this application. Two parts 6 that are to be cleaned, and which have contamination, are located in a bath 4 that is filled with water or with another suitable cleaning medium 5. At least one ultrasonic transducer 7 (solid line) is coupled to the bath 4 and to the water (cleaning medium) 5 inside it, and is designed for the generation and output of ultrasonic waves to the medium 5. These ultrasonic waves bring about the cleaning of the parts 6 from the contamination in a manner known per se. It is within the scope of the invention not only to provide one ultrasonic transducer 7, but a plurality of ultrasonic transducers (accordingly suggested in FIG. 1 with dotted lines).

The ultrasonic transducer 7 is effectively connected in an electrical and a signal sense (via a cable 8) to a (frequency) generator 9. The generator 9 comprises a signal unit 10 which is designed to generate a high-frequency excitation signal with a variable excitation frequency 1. The excitation signal is transmitted from the signal unit 10 and/or the generator 9 via the effective electrical connection 8, for example a signal line, to the ultrasonic transducer 7. The ultrasonic transducer 7 is thus excited to generate (ultrasonic) sound waves, which are accordingly coupled into the medium 5 for cleaning the parts 6.

Figure 2:
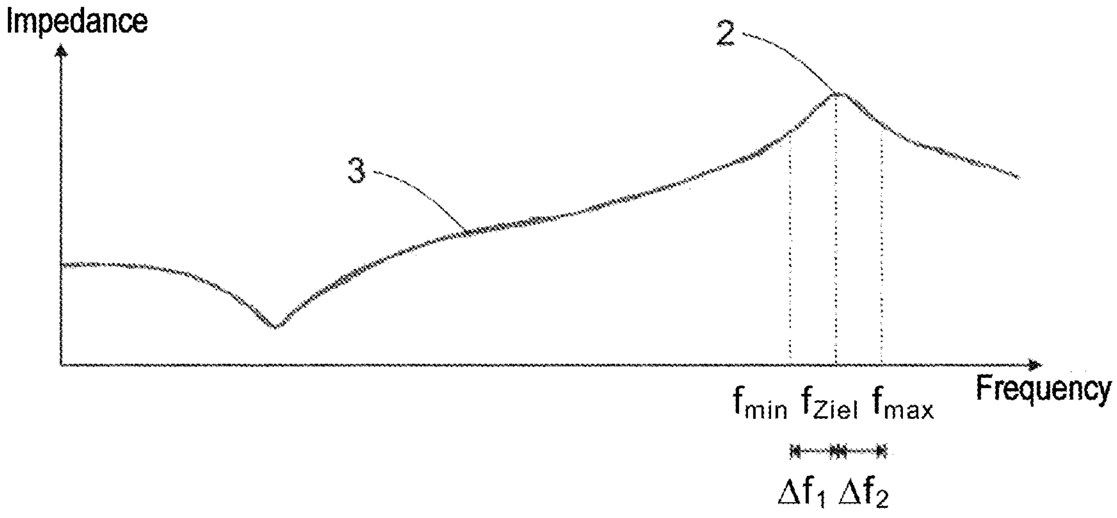
FIG. 2 shows a sweep modulation according to the prior art with reference to an impedance-frequency diagram.

A method for the modulation of the excitation frequency 1 of the ultrasonic transducer 7 according to the prior art is illustrated schematically in FIG. 2. FIG. 2 shows an impedance curve 3 of the ultrasonic transducer 7 as is usually exhibited by the ultrasonic transducer 7 in the present context. The excitation frequency 1 that is generated by the generator 9 is varied between a minimum frequency $f_{min}$ and a maximum frequency $f_{max}$. A target frequency $f_{Ziel}$ lies between the minimum frequency $f_{min}$ and the maximum frequency $f_{max}$. In the present example of FIG. 2, the impedance curve 3 exhibits a local maximum 2 in the region of the target frequency $f_{Ziel}$. In this context, a resonant frequency of the ultrasonic transducer 7 at the position of the local maximum 2 is also spoken of. The excitation of the ultrasonic transducer 7 in the vicinity of its resonant frequency (or frequencies) increases the amplitude of oscillation for a given excitation power, and thus the effective efficiency of the sound transduction. The excitation of ultrasonic transducers 7 in the neighborhood of their resonant frequency (or frequencies) is known in order to achieve the highest possible efficiency.

A first frequency difference $\Delta f_1$ between the minimum frequency $f_{min}$ and the target frequency $f_{Ziel}$ in FIG. 2 is the same in terms of magnitude as a second frequency difference $\Delta f_2$ between the maximum frequency $f_{max}$ and the target frequency $f_{Ziel}$. It is assumed in the prior art, that such a symmetrical design of equal magnitudes of the minimum frequency $f_{min}$ and the maximum frequency $f_{max}$ around the target frequency $f_{Ziel}$ leads to particularly good results.

Figure 3:
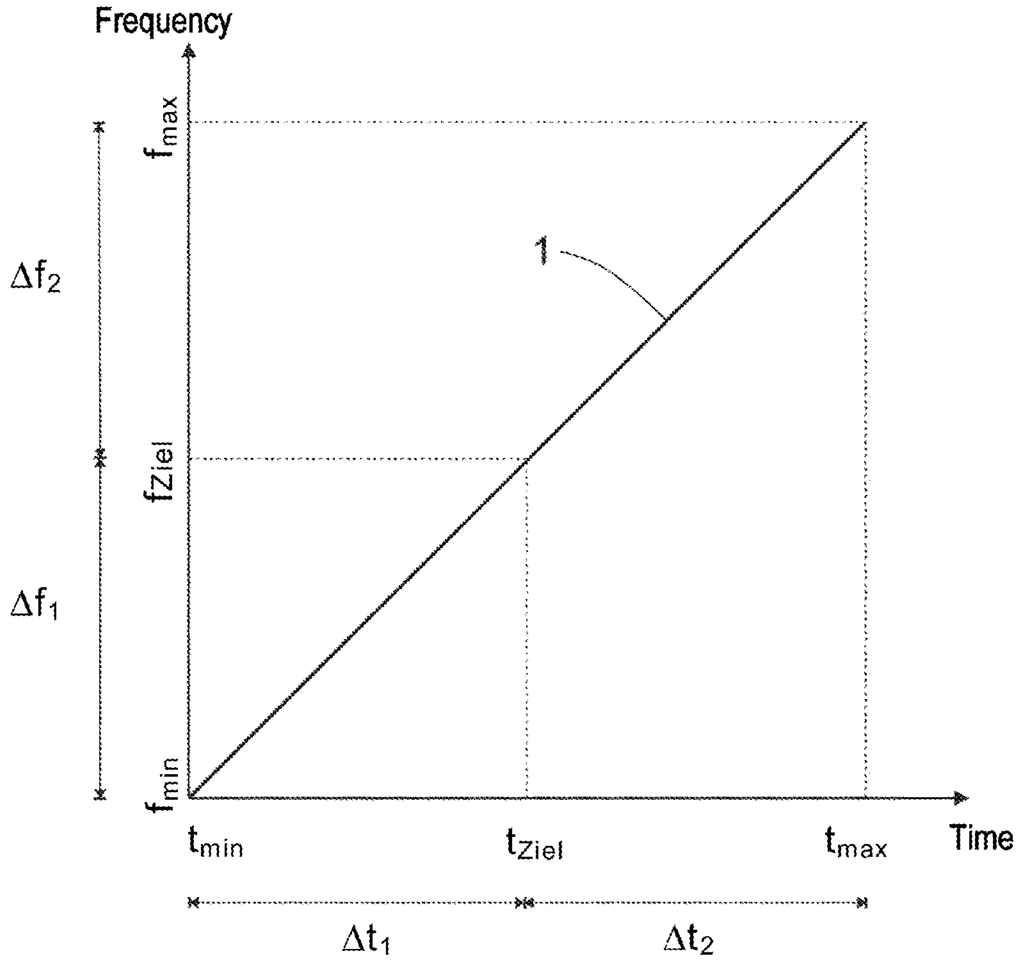
FIG. 3 shows the sweep modulation of FIG. 1 with the aid of an associated frequency-time diagram.

FIG. 3 shows a time-dependency of the excitation frequency 1 in a frequency-time diagram. This, similarly to FIG. 2, is taken from the prior art. It can be seen that the first frequency difference $\Delta f_1$ and the second frequency difference $\Delta f_2$ are equal in terms of magnitude, as in FIG. 2.

A point in time $t_{Ziel}$ is defined as that point in time at which the excitation frequency 1 corresponds in terms of magnitude to the frequency $f_{Ziel}$. A point in time $t_{min}$ is defined as the point in time at which the excitation frequency 1 corresponds in terms of magnitude to the frequency $f_{min}$. A point in time $t_{max}$ is defined as that point in time at which the excitation frequency 1 corresponds in terms of magnitude to the frequency $f_{max}$. A first time difference $\Delta t_1$ is calculated from the difference between the point in time $t_{Ziel}$ and the point in time $t_{min}$. A second time difference $\Delta t_2$ is calculated from the difference between the point in time $t_{max}$ and the point in time $t_{Ziel}$. In FIG. 3 the first time difference $\Delta t_1$ is equal in terms of magnitude to the second time difference $\Delta t_2$.

A frequency sweep begins at the point in time $t_{min}$ and ends at the point in time $t_{max}$, or vice versa. In FIG. 3, the excitation frequency 1 therefore has the form of a straight line during a frequency sweep.

Various methods are known from the prior art for carrying out this type of frequency modulation. If the excitation frequency 1 is set to the minimum frequency $f_{min}$ after the end of a frequency sweep, then we speak of sawtooth modulation. If the excitation frequency 1 is not set to the minimum frequency $f_{min}$ after the end of a frequency sweep, but instead falls linearly starting from the maximum frequency $f_{max}$, then we speak of triangular modulation. The symmetrical configuration of the modulation of the excitation frequency 1 around the target frequency entails in the previously known methods that a first derivative of the excitation frequency 1 is constant in terms of magnitude during a frequency sweep. Under the prior art, the minimum frequency $f_{min}$, the maximum frequency $f_{max}$ and the target frequency $f_{Ziel}$ are not normally changed after the completion of a frequency sweep. The previously mentioned disadvantages relating to the generator 9, which generator 9 generates the excitation frequency 1 or provides the excitation signal, result in particular from this. These disadvantages consist, amongst other things, in an increased thermal loss created in the generator 9, said loss having a proportional relationship to the frequency swing used for the sweep modulation: a greater frequency swing entails a greater thermal loss.

Figure 4:
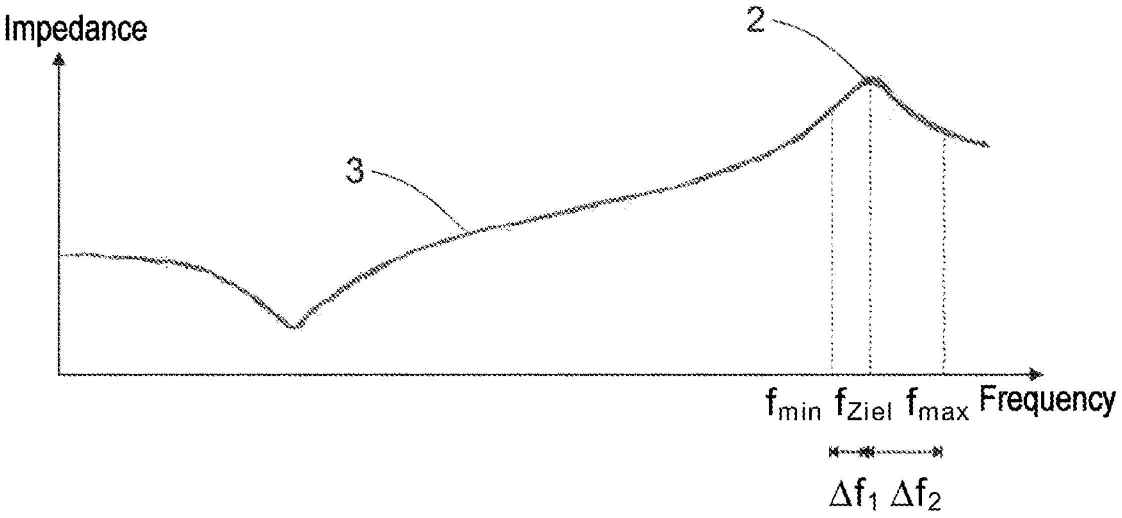
FIG. 4 shows a sweep modulation according to the invention with the aid of an impedance-frequency diagram.

A method according to the invention for the modulation of the excitation frequency 1 for the operation of the ultrasonic transducer 7 is illustrated in FIG. 4. As explained previously with reference to FIG. 2, the target frequency $f_{Ziel}$ is located in the present exemplary embodiment in the region of a local maximum 2 of the impedance curve 3 of the ultrasonic transducer 7. The minimum frequency $f_{min}$ is smaller in terms of magnitude than the target frequency $f_{Ziel}$, the maximum frequency $f_{max}$ is larger in terms of magnitude than the target frequency $f_{Ziel}$. The maximum frequency $f_{max}$ and the minimum frequency $f_{min}$ are selected in such a way that the first frequency difference $\Delta f_1$ is smaller in terms of magnitude than the second frequency difference $\Delta f_2$. The target frequency $f_{Ziel}$ accordingly is not located in the center between $f_{min}$ and $f_{max}$.

Figure 5:
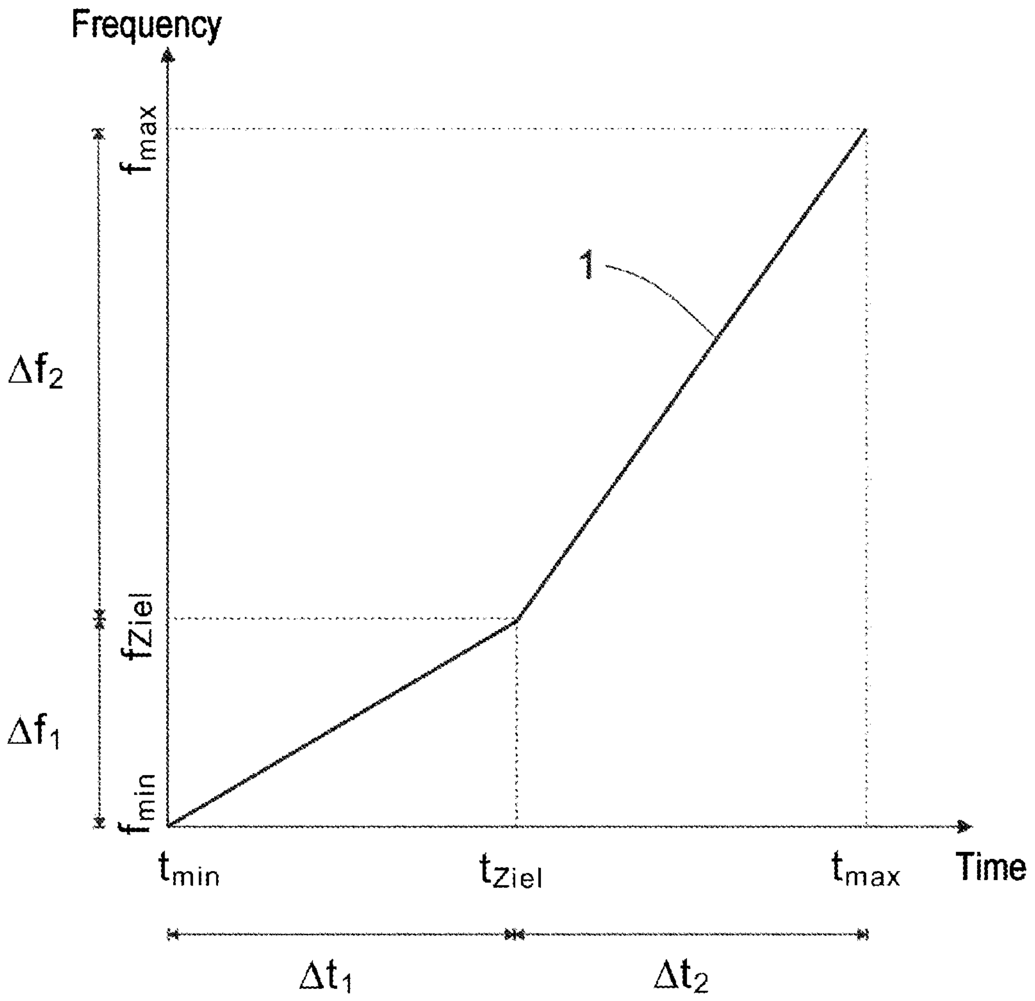
FIG. 5 shows the frequency-time diagram of the sweep modulation according to the invention belonging to FIG. 4.

The frequency-time diagram belonging to FIG. 4 is illustrated in FIG. 5. The first time difference $\Delta t_1$ between the point in time $t_{Ziel}$ and the point in time $t_{min}$ and the second time difference $\Delta t_2$ between the point in time $t_{max}$and the point in time $t_{Ziel}$ are equal in terms of magnitude. This means that a first time-derivative of the excitation frequency 1 in the range between $t_{min}$ and $t_{Ziel}$ is, at least as an arithmetic mean, smaller than a first time-derivative of the excitation frequency 1 in the range between $t_{Ziel}$ and $t_{max}$. According to FIG. 4, the change in the excitation frequency 1 with time in the region from point in time $t_{min}$ up to point in time $t_{Ziel}$ and also in the region from point in time $t_{Ziel}$ up to point in time $t_{max}$ each exhibit the form of a straight line. Here in the present case, the gradient of this straight line in the region between $t_{Ziel}$ and $t_{max}$is larger in terms of magnitude than in the region between $t_{min}$ and $t_{Ziel}$. Expressed in other words, this means that the ultrasonic transducer 7 in the first region between $t_{min}$ and $t_{Ziel}$ is excited in the same time over a smaller frequency spectrum than in the region between $t_{Ziel}$ and $t_{max}$. We can also speak of a lower rate of frequency change in the first region between $t_{min}$ and $t_{Ziel}$ in comparison with the second region between $t_{Ziel}$ and $t_{max}$.

Since the temporal progression of the drive signal (excitation frequency f(t)) between the first point in time $t_{min}$ and the second point in time $t_{Ziel}$ as well as between the second point in time $t_{Ziel}$ and the third point in time $t_{max}$ exhibit different gradients from one another, a bend results in the f(t) diagram on a corresponding graphical illustration. According to the embodiment in FIG. 5, the associated bend angle is less than 180°.

Figure 6:
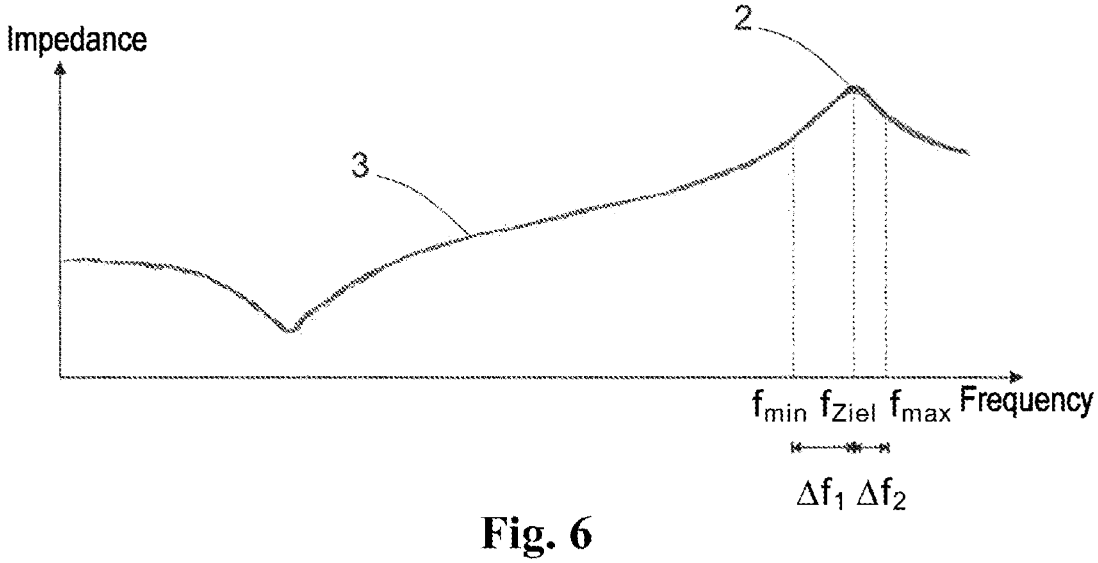
FIG. 6 shows a further aspect of the sweep modulation according to the invention according to FIG. 4 and FIG. 5 with respect to an impedance-frequency diagram.

FIG. 6 shows the same impedance curve 3 of the ultrasonic transducer 7 on an impedance-frequency diagram like FIG. 4. The target frequency $f_{Ziel}$ again lies in the region of the local maximum 2 of the impedance curve 3 of the ultrasonic transducer 7. It can be seen that in FIG. 6, unlike FIG. 4, the first frequency difference $\Delta f_1$ is larger in terms of magnitude than the second frequency difference $\Delta f_2$. This can be seen on the frequency-time diagram in FIG. 7. The two-time differences $\Delta t_1$ and $\Delta t_2$ are again equal in terms of magnitude. The change in the excitation frequency 1 over time again exhibits the form of a straight line in the first region from $t_{min}$ to $t_{Ziel}$ and in the second region from $t_{Ziel}$ to $t_{max}$. Here, however, in contrast to FIG. 5, the first time-derivative of the excitation frequency 1 in the first region between $t_{min}$ and $t_{Ziel}$ is larger in terms of magnitude than in the second region between $t_{Ziel}$ and $t_{max}$. Expressed otherwise, the gradient of the straight line in FIG. 7 in the region between $t_{Ziel}$ and $t_{max}$ is smaller in terms of magnitude than in the region between $t_{min}$ and $t_{Ziel}$.

Since the temporal progression of the drive signal (excitation frequency f(t)) between the first point in time $t_{min}$ and the second point in time $t_{Ziel}$ as well as between the second point in time $t_{Ziel}$ and the third point in time $t_{max}$ exhibit different gradients from one another, a bend again results in the f(t) diagram on a corresponding graphical illustration. According to the embodiment in FIG. 7, the associated bend angle is more than 180°.

Figure 7:
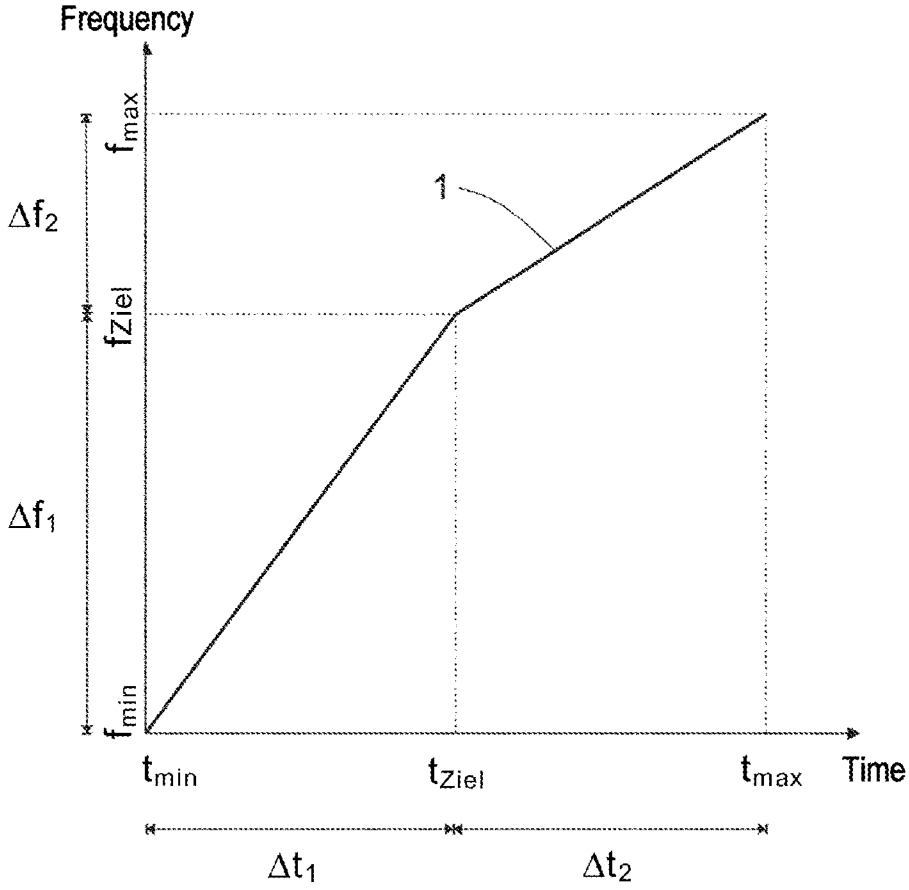
FIG. 7 shows the frequency-time diagram belonging to FIG. 6.

The relationship illustrated in FIGS. 4 and 5 between the minimum frequency $f_{min}$, the maximum frequency $f_{max}$ and the target frequency $f_{Ziel}$, as well as the impedance curve 3 of the ultrasonic transducer, is used on average in about half of all frequency sweeps. In the other approximate half of the frequency sweeps, a combination of the corresponding parameters according to FIG. 6 and FIG. 7 is used.

Figure 8:
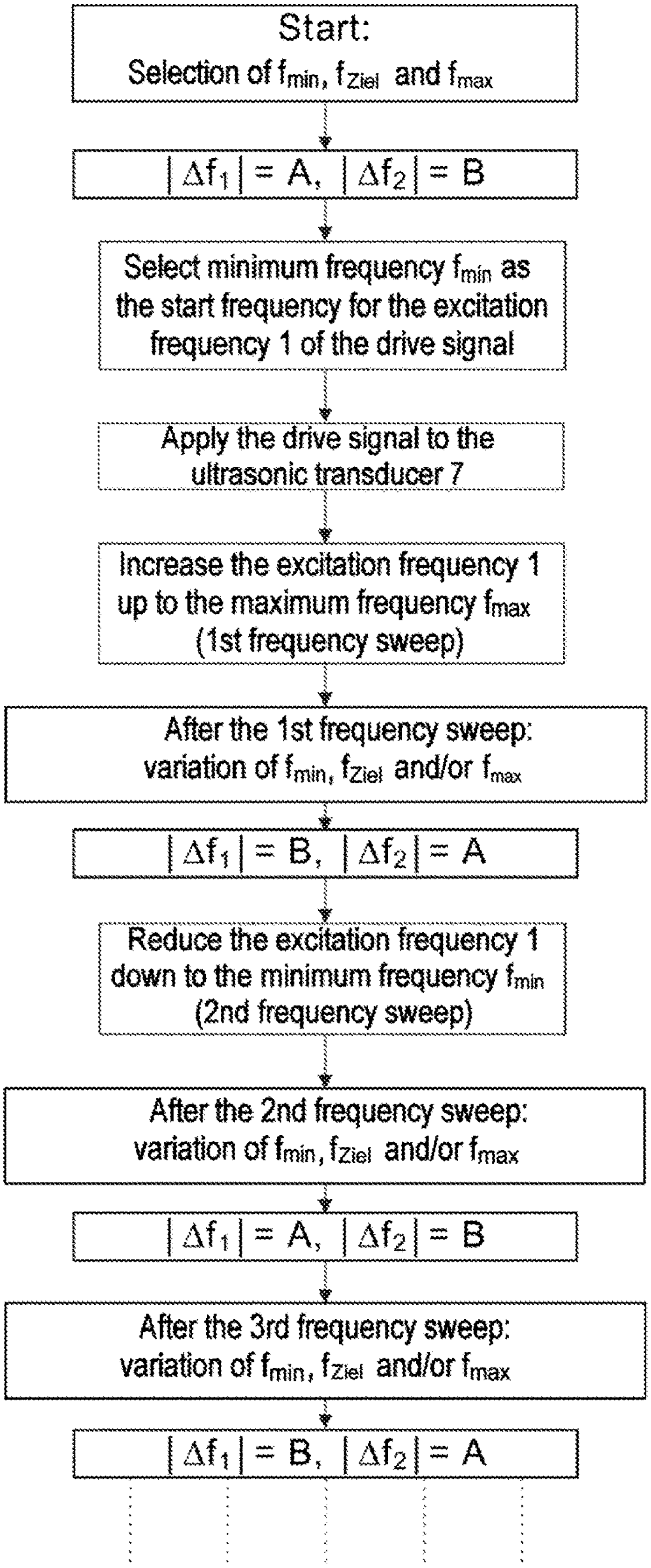
FIG. 8 shows a flow diagram of a sweep modulation according to the invention.

An exemplary temporal sequence of individual steps of the method according to the invention is illustrated in FIG. 8. First, the minimum frequency $f_{min}$, the target frequency $f_{Ziel}$ and the maximum frequency $f_{max}$ are selected such that the magnitude of the first frequency difference $\Delta f_1$=A and the magnitude of the second frequency difference $\Delta f_2$=B. In a first frequency sweep, a drive signal with an excitation frequency 1 equal to the minimum frequency $f_{min}$ is generated by the signal unit 10 of the generator 9, and transmitted to the ultrasonic transducer 7 (or the ultrasonic transducers). In the course of the first frequency sweep, the excitation frequency 1 is increased up to the maximum frequency $f_{max}$. After a first frequency sweep has been completed, the minimum frequency $f_{min}$, the target frequency $f_{Ziel}$ and/or the maximum frequency $f_{max}$ are varied such that the magnitude of the first frequency difference $\Delta f_1$ is now B and the magnitude of the second frequency difference $\Delta f_2$ is now A. The excitation frequency 1 is now reduced from the maximum frequency $f_{max}$ down to the minimum frequency $f_{min}$. A triangular progression of the drive signal, or of the excitation frequency 1 of the drive signal, thus results. As previously explained, the progression can, for example, also have a sawtooth form, if the excitation frequency after the end of the first frequency sweep is increased again starting from the minimum frequency $f_{min}$.

It is clear that the maximum frequency $f_{max}$, or any other frequency within the frequency sweep range, can also be used as the starting point for the modulation of the excitation frequency 1.

After the second frequency sweep has ended, the magnitudes of the two frequency differences are chosen again to be $\Delta f_1$=A and $\Delta f_2$=B. After the end of the third frequency sweep, correspondingly again to $\Delta f_1$=B and $\Delta f_2$=A, etc.

Taking an arithmetic mean over all frequency sweeps, the first frequency difference $\Delta f_1$ and the second frequency difference $\Delta f_2$ are therefore equal in terms of magnitude, each having the magnitude (A+B)/2. In the frequency-time diagram, this means that the first time-derivative of the excitation frequency 1 in the first region between $t_{min}$ and $t_{Ziel}$ is on average approximately equal in terms of magnitude as in the second region between $t_{Ziel}$ and $t_{max}$.

The change of the excitation frequency 1 on the frequency-time diagram can not only have the form of a straight line, but can also adopt other kinds of shape or progressions. For example the excitation frequency 1 can change quadratically with time, $f=f(t^2)$.

Figure 9:
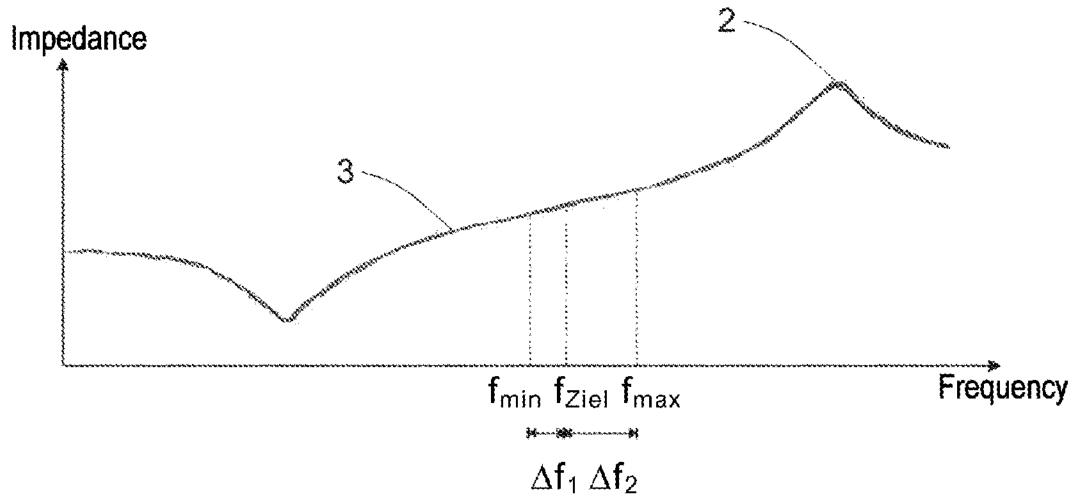
FIG. 9 shows a sweep modulation according to the invention in an alternative embodiment with the aid of an impedance-frequency diagram.
Figure 10:
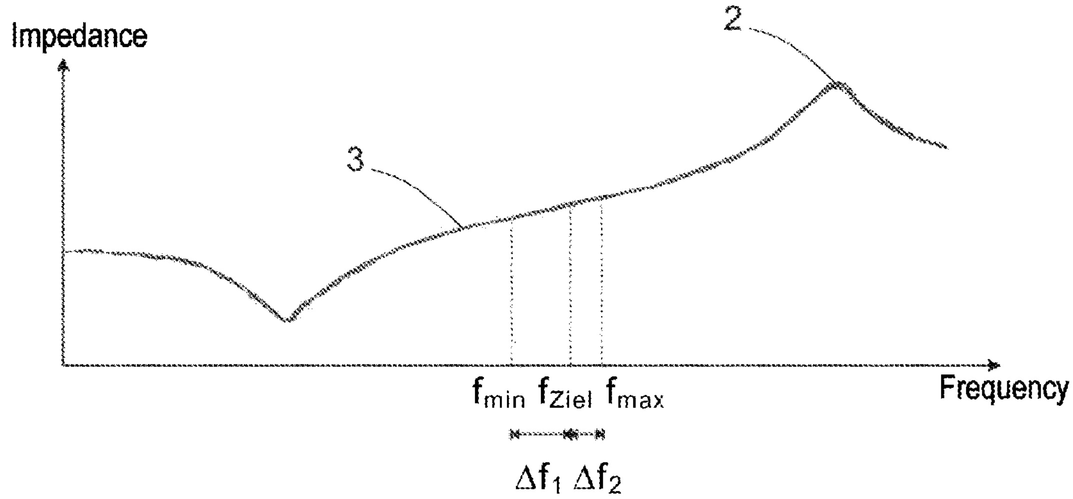
FIG. 10 shows a further aspect of the sweep modulation of FIG. 9 with the aid of an impedance-frequency diagram.

FIGS. 9 and 10 each show a further method according to the invention for the modulation of the excitation frequency 1 on an impedance-frequency diagram. In contrast to FIGS. 2, 4 and 6, the target frequency $f_{Ziel}$ is not approximately equal to the local maximum 2 of the impedance curve 3 of the ultrasonic transducer 7. The target frequency $f_{Ziel}$, and correspondingly both the minimum frequency $f_{min}$ and the maximum frequency $f_{max}$, can rather be located at arbitrary positions on the impedance curve 3.

Figure 11:
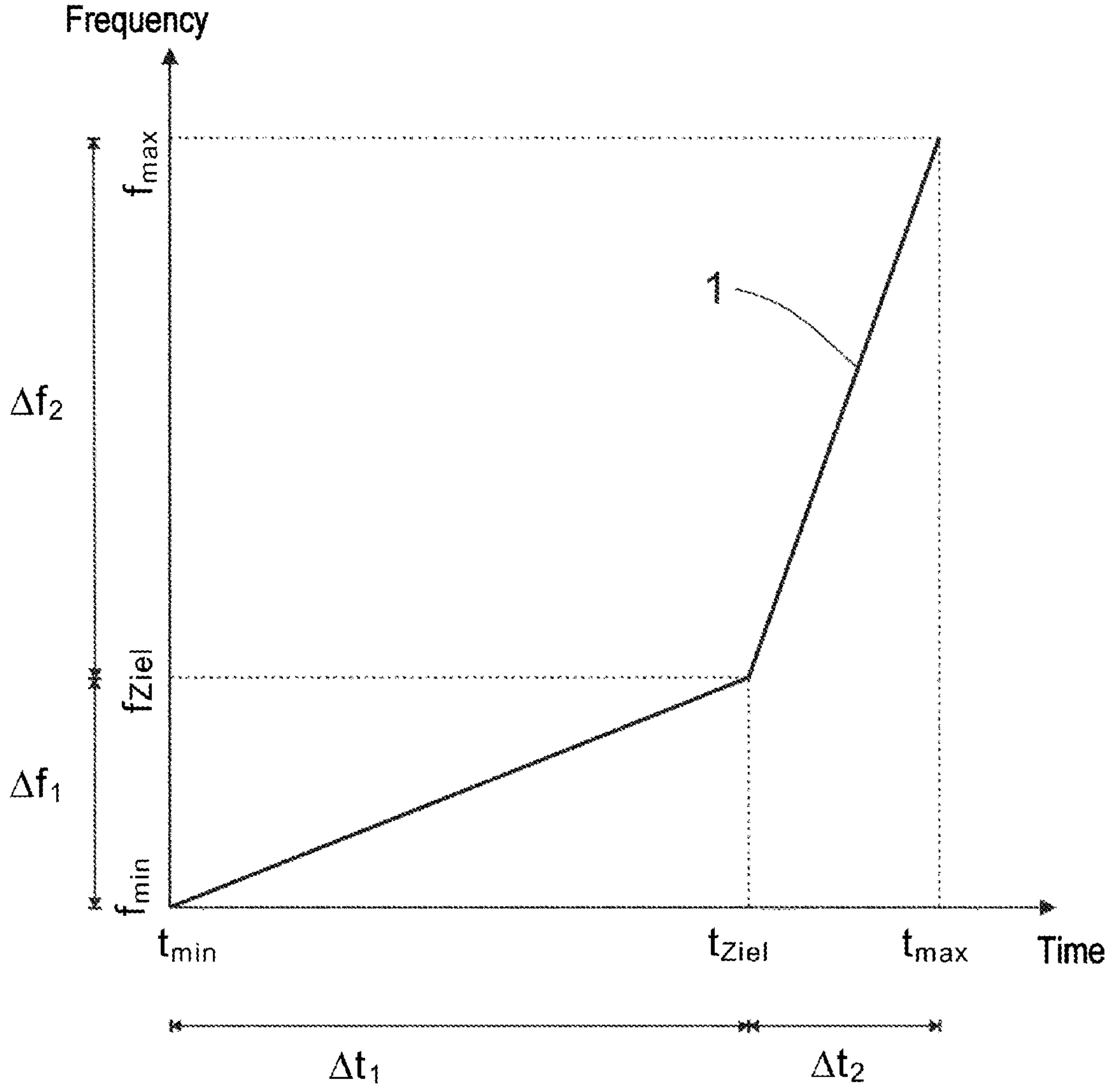
FIG. 11 shows a further sweep modulation according to the invention in a frequency-time diagram.

A temporal progression of the change in the excitation frequency 1 is illustrated in FIG. 11 for the case in which the first time difference $\Delta t_1$ and the second time difference $\Delta t_2$ differ from one another in terms of magnitude. It is also possible, with a specific ratio between the first time difference $\Delta t_1$ and the second time difference $\Delta t_2$, for the temporal progression of the change of the excitation frequency 1 within a frequency sweep to have the form of a straight line without a bend, although the first frequency difference $\Delta f_1$ and the second frequency difference $\Delta f_2$ differ from one another in terms of magnitude.

The invention claimed is:

1. A method for the excitation of one or a plurality of transducers (7), said transducers (7) being designed for generation of sound waves and exhibiting operating frequencies that define a transducer frequency range, the method comprising:

generating an electrical excitation signal for the transducers (7) with a generator (9) which has an electrical connection (8) to the transducers (7) and a frequency sweep function for the generation of an electrical excitation signal with a variable excitation frequency (1), and supplying said excitation signal to the transducers (7), the generator (9) carrying out an integral number of frequency sweeps at an adjustable sweep rate in a frequency sweep range between a minimum frequency ($f_{min}$) and a maximum frequency ($f_{max}$), defining a target frequency within the frequency sweep range, selecting the minimum frequency ($f_{min}$), the maximum frequency ($f_{max}$) and the target frequency ($f_{Ziel}$) such that a first frequency difference ($\Delta f_1$) between the minimum frequency ($f_{mm}$) and the target frequency ($f_{Ziel}$) in a first number of frequency sweeps from a total number of frequency sweeps, differs in terms of magnitude from a second frequency difference ($\Delta f_2$) between the maximum frequency ($f_{max}$) and the target frequency ($f_{Ziel}$l), and modifying at least one of the minimum frequency ($f_{min}$), the maximum frequency ($f_{max}$), or the target frequency ($f_{Ziel}$) after at least one said frequency sweep in such a way that an arithmetic mean of the first frequency differences ($\Delta f_1$) formed over all the frequency sweeps carried out and an arithmetic mean of the second frequency differences ($\Delta f_2$) formed over all the frequency sweeps carried out are substantially equal in terms of magnitude.

2. The method as claimed in claim 1, further comprising changing at least one of the minimum frequency ($f_{min}$) or the maximum frequency ($f_{max}$) after the completion of at least one frequency sweep.

3. The method as claimed in claim 1, further comprising selecting the minimum frequency ($f_{min}$), the maximum frequency ($f_{max}$) and the target frequency ($f_{Ziel}$) such that during a first one of the frequency sweeps, the first frequency difference ($\Delta f_1$) has a first magnitude (A), and the second frequency difference ($\Delta f_2$) has a second magnitude (B), and wherein, in a subsequent frequency sweep, modifying at least the target frequency as well as at least one of the minimum frequency ($f_{min}$) or the maximum frequency ($f_{max}$) such that the first frequency difference ($\Delta f_1$) has the second magnitude (B) and the second frequency difference ($\Delta f_2$) has the first magnitude (A), wherein the first magnitude (A) and the second magnitude (B) differ.

4. The method as claimed in claim 1, wherein the target frequency ($f_{Ziel}$) is changed after the completion of at least one said frequency sweep.

5. The method as claimed in claim 1, further comprising, in the course of at least one of the frequency sweeps, varying the excitation frequency (1) of the drive signal in such that the drive signal has the minimum frequency ($f_{min}$) at a first point in time ($t_1$), the target frequency ($f_{Ziel}$) at a second point in time ($t_2$), and the maximum frequency ($f_{max}$) at a third point in time ($t_3$), wherein the second point in time ($t_2$) lies between the first point in time ($t_1$) and the third point in time ($t_3$), and wherein a first time difference ($\Delta t_1$) between the first point in time ($t_1$) and the second point in time ($t_2$) and a second time difference ($\Delta t_1$) between the second point in time ($t_2$) and the third point in time ($t_3$) are equal in terms of magnitude.

6. The method as claimed in claim 5, wherein the frequency sweep is selected such that in the course of at least one said frequency sweep, a first derivative of the frequency with respect to time has a constant first derivative magnitude between the first point in time ($t_1$) and the second point in time ($t_2$), and has a constant second derivative magnitude between the second point in time ($t_2$) and the third point in time ($t_3$).

7. The method as claimed in claim 6, wherein the frequency sweep is selected such that in the course of at least one said frequency sweep, the first derivative magnitude and the second derivative magnitude differ from one another.

8. The method as claimed in claim 1, further comprising during a plurality of, exciting at least one of the transducers (7) at a respective resonant frequency.

9. The method as claimed in claim 8, further comprising during in the course of a plurality of said frequency sweeps, exciting at least one of the transducers (7) at a respective resonant frequency of a same order.

10. The method as claimed in claim 8, further comprising choosing the target frequency to correspond substantially to a resonant frequency of at least one transducer (7).

11. A sound generation arrangement, comprising:

at least one transducer (7): and with a generator (9) which has an electrical connection (8) to the transducer (7), said generator (9) being provided for the generation of an electrical excitation signal for the transducer (7) and comprising a frequency sweep function for generation of an electrical excitation signal with a variable excitation frequency (1), said excitation signal being provided for supply to the transducer (7);

said generator (9) being configured provided and designed to carry out, with an adjustable sweep rate, an integral number of frequency sweeps in a frequency sweep range between a minimum frequency ($f_{min}$) and a maximum frequency ($f_{max}$), with a target frequency ($f_{Ziel}$) defined within the frequency sweep range; and wherein the minimum frequency ($f_{min}$), the maximum frequency ($f_{max}$) and the target frequency ($f_{Ziel}$) are selected such that a first frequency difference ($\Delta f_1$) between the minimum frequency ($f_{min}$) and the target frequency ($f_{Ziel}$) in a first number of said frequency sweeps from a total number of frequency sweeps, differs in terms of magnitude from a second frequency difference ($\Delta f_2$) between the maximum frequency ($f_{max}$) and the target frequency ($f_{Ziel}$), and wherein at least one of the minimum frequency ($f_{min}$), the maximum frequency ($f_{max}$), or the target frequency ($f_{Ziel}$) is modifiable after at least one frequency sweep such that an arithmetic mean of the first frequency differences ($\Delta f_1$) formed over all the frequency sweeps carried out and an arithmetic mean of the second frequency differences ($\Delta f_2$) formed over all the frequency sweeps carried out are substantially equal in terms of magnitude.

12. The method as claimed in claim 8, further comprising choosing the target frequency to correspond substantially to corresponding to a frequency in the transducer frequency range corresponding to a frequency that is formed from an arithmetic averaging of more than one off the resonant frequencies in the transducer frequency range.

* * * * *